United States Patent
Lee et al.

(10) Patent No.: US 9,685,970 B1
(45) Date of Patent: Jun. 20, 2017

(54) ANALOG-TO-DIGITAL CONVERTING SYSTEM AND CONVERTING METHOD

(71) Applicants: National Taiwan University, Taipei (TW); Media Tek Inc., Hsinchu (TW)

(72) Inventors: Tai-Cheng Lee, Taipei (TW); Chin-Yu Lin, Taipei (TW); Yen-Hsin Wei, Taipei (TW)

(73) Assignees: NATIONAL TAIWAN UNIVERSITY, Taipei (TW); MEDIA TEK INC., Hsinchu (TW)

( * ) Notice: Subject to any disclaimer, the term of this patent is extended or adjusted under 35 U.S.C. 154(b) by 0 days.

(21) Appl. No.: 15/223,484

(22) Filed: Jul. 29, 2016

(30) Foreign Application Priority Data

Mar. 2, 2016 (TW) .............................. 105106403 A

(51) Int. Cl.
*H03M 1/10* (2006.01)
*H03M 1/12* (2006.01)
*H03M 1/00* (2006.01)

(52) U.S. Cl.
CPC ....... *H03M 1/1009* (2013.01); *H03M 1/1245* (2013.01); *H03M 1/00* (2013.01); *H03M 1/12* (2013.01)

(58) Field of Classification Search
CPC .................................. H03M 1/00; H03M 1/12
USPC .......................... 341/120, 118, 122, 155, 156
See application file for complete search history.

(56) References Cited

U.S. PATENT DOCUMENTS

2012/0213531 A1* 8/2012 Nazarathy ............. H03M 1/145
398/202

FOREIGN PATENT DOCUMENTS

TW 201406070 A 2/2014

OTHER PUBLICATIONS

Behzad Razavi, Design Considerations for Interleaved ADCs, IEEE Journal of Solid-State Circuits, 2013, 1806-1817, vol. 48 No. 8.
Behzad Razavi, Problem of timing mismatch in interleaved ADCs, IEEE, 2012.

* cited by examiner

Primary Examiner — Joseph Lauture
(74) Attorney, Agent, or Firm — Locke Lord LLP; Tim Tingkang Xia, Esq.

(57) ABSTRACT

An analog-to-digital converting system includes at least one first main analog-to-digital converting unit, at least one second main analog-to-digital converting unit, at least one auxiliary analog-to-digital converting unit, and a calibration unit. Each first main analog-to-digital converting unit is located on a first channel. The first channel includes sample period. Each first main analog-to-digital converting unit receives a first sampling value. Each first sampling value includes a first sample clock. An analog-to-digital converting method calibrates timing-skew of the analog-to-digital converters by delaying a time difference on the sampling value.

8 Claims, 7 Drawing Sheets

Fig. 5

ANALOG-TO-DIGITAL CONVERTING SYSTEM AND CONVERTING METHOD

CROSS-REFERENCE TO RELATED APPLICATION

This application claims priority of application No. 105106403, filed on Mar. 2, 2016 in the Taiwan Intellectual Property Office.

FIELD OF THE INVENTION

The invention relates to analog-to-digital converting systems and converting methods, and more particularly to an analog-to-digital converting system and converting method which combines digital timing-skew correction techniques and a delta-sampling technique in the analog domain to have a wide signal bandwidth beyond 1 Gigahertz.

BACKGROUND OF THE INVENTION

Recent radio architectures, such as Wireless Gigabit Alliance (WiGig) and 5th generation mobile networks (5G), require analog-to-digital converters with bandwidth beyond 1 GigaHertz (GHz) and effective number of bits (ENOB) of 6-to8 bits while retaining excellent power efficiency for long battery life.

Therefore, many time-interleaved successive approximation analog-to-digital converters are used in a distributed sampling scheme, leaving the timing-skew problem to be resolved by calibration.

Only a few timing-skew calibration algorithms have been reported for interleaved analog-to-digital converters (ADCs) to correct timing errors in the analog domain or in the digital domain.

With reference to Taiwan patent No. 201406070, various multi-lane ADCs are disclosed that substantially compensate for impairments present within various signals that result from various impairments, such as phase offset, amplitude offset, and/or DC offset to provide some examples, such that their respective digital output samples accurately represent their respective analog inputs. Generally, the various multi-lane ADCs determine various statistical relationships, such as various correlations to provide an example, between these various signals and various known calibration signals to quantify the phase offset, amplitude offset, and/or DC offset that may be present within the various signals. The various multi-lane ADCs adjust the various signals to substantially compensate for the phase offset, amplitude offset, and/or DC offset based upon these various statistical relationships such that their respective digital output samples accurately represent their respective analog inputs.

The drawback of analog correction includes a feedback-induced stability hazard and jitter introduced by the controlled delay line. Digital-domain correction takes advantage of technology scaling but the complex slope-extraction filter limits signal bandwidth.

SUMMARY OF THE INVENTION

One objective of the invention is to provide an analog-to-digital converting system. In one embodiment, the analog-to-digital converting system comprises at least one first main analog-to-digital converting unit, at least one second main analog-to-digital converting unit, at least one auxiliary analog-to-digital converting unit, and a calibrating unit.

The first main analog-to-digital converting unit is located on a first channel. The first channel has sample period T. Each first main analog-to-digital converting unit receives a first sampled value. Each first sampled value has a first sample clock. The first sample clock corresponds to the sample period T. The first main analog-to-digital converting unit converts the first sampled value to a first skew-free quantized sequence $Y_{m,1}(N)$, where N is a natural number.

The second main analog-to-digital converting unit is located on a second channel. The second channel has the sample period T which is the same as the first channel's. Each second main analog-to-digital converting unit receives a second sampled value $y_9(nT-t_s)$. Each second sampled value $y_9(nT-t_s)$ has a second sample clock and a skew time $t_s$. The second sample clock corresponds to the sample period T. Each second main analog-to-digital converting unit converts the second sampled value $y_9(nT-t_s)$ to a second skew quantized sequence $Y_{m,9}(N)$, where n is an integer.

The auxiliary analog-to-digital converting unit is located on an auxiliary channel next to the first channel or the second channel. Each auxiliary analog-to-digital converting unit receives a corresponding analog signal and a corresponding delayed analog signal $y_9(nT-t_s+\Delta T)$. The corresponding analog signal corresponds to the second sampled value $y_9(nT-t_s)$. The $y_9(nT-t_s+\Delta T)$ of the corresponding delayed analog signal $y_9(nT-t_s+\Delta T)$ is obtained from delaying a known time difference $\Delta T$ from $nT-t_s$ of the second sampled value. Each auxiliary analog-to-digital converting unit quantizes a difference $y_9(nT-t_s+\Delta T)-y_9(nT-t_s)$ between the corresponding analog signal and the corresponding delayed analog signal to produce an auxiliary quantized sequence $Y_{a,9}(N)$.

The calibrating unit is connected with the first main analog-to-digital converting unit, the second main analog-to-digital converting unit, and the auxiliary analog-to-digital converting unit. The calibrating unit receives the sample period T, the first skew-free quantized sequence $Y_{m,1}(N)$, the skew time $t_s$, the second skew quantized sequence $Y_{m,9}(N)$ and the auxiliary quantized sequence $Y_{a,9}(N)$, and produces a skew-free quantized sequence $Y_9(N)$ of the second channel through a correction equation. The correction equation is defined as: $Y_9(N)=Y_{m,9}(N)+Y_{a,9}(N)[0-(-t_s)]/[(-t_s+\Delta T)-(-t_s)]$.

Another objective of the invention is to provide a converting method for an analog-to-digital converting system. In one embodiment, the converting method comprises:

step A: providing at least one first main analog-to-digital converting unit, at least one second main analog-to-digital converting unit, at least one auxiliary analog-to-digital converting unit, and a calibrating unit, wherein each second main analog-to-digital converting unit is located on a second channel, and the second channel has sample period T;

step B: each first main analog-to-digital converting unit receiving a first sampled value and converting the first sampled value to a first skew-free quantized sequence $Y_{m,1}(N)$, wherein each first sampled value has a first sample clock, the first sample clocks corresponding to the sample period T;

step C: each second main analog-to-digital converting unit receiving a second sampled value $y_9(nT-t_s)$ and converting the second sampled value $y_9(nT-t_s)$ to a second skew quantized sequence $Y_{m,9}(N)$, wherein each second sampled value $y_9(nT-t_s)$ has a second sample clock and a skew time $t_s$, the second sample clocks corresponding to the sample period T;

step D: each auxiliary analog-to-digital converting unit receiving a corresponding analog signal and a corresponding delayed analog signal $y_9(nT-t_s+\Delta T)$, and quantizing a difference $y_9(nT-t_s+\Delta T)-y_9(nT-t_s)$ between the corresponding analog signal and the corresponding delayed analog signal to produce an auxiliary quantized sequence $Y_{a,9}(N)$, the corresponding analog signal corresponding to the second sampled value $y_9(nT-t_s)$, the corresponding delayed analog signal $y_9(nT-t_s+\Delta T)$ delaying a known time difference $\Delta T$ from $nT-t_s$ of the second sampled value to get $y_9(nT-t_s+\Delta T)$; and step E: the calibrating unit receiving the sample period T, the first skew-free quantized sequence $Y_{m,1}(N)$, the skew time $t_s$, the second skew quantized sequence $Y_{m,9}(N)$ and the auxiliary quantized sequence $Y_{a,9}(N)$, and producing a skew-free quantized sequence of second channel through a correction equation, the correction equation defined as:

$$Y_9(N)=Y_{m,9}(N)+Y_{a,9}(N)[0-(-t_s)]/[(-t_s+\Delta T)-(-t_s)].$$

Through the above system and method, the auxiliary analog-to-digital converting unit of the present invention quantizes a difference between the corresponding analog signal and the corresponding delayed analog signal through delaying a known time difference $\Delta T$ by analog form, which has a smaller signal swing and achieves a 2.6 GHz sampling rate and a wide signal bandwidth compared with the prior art analog-to-digital converters.

BRIEF DESCRIPTION OF THE DRAWINGS

FIG. 5 is a perspective view showing the quantized sequence of the present invention;

DETAILED DESCRIPTION OF THE INVENTION

In order to describe details of the preferred embodiments of the present invention, description of the structure, and the application as well as the steps are made with reference to the accompanying drawings. It is learned that after the description, any variation, modification or the like to the structure and the steps of the embodiments of the preferred embodiments of the present invention is easily made available to any person skilled in the art. Thus, the following description is only for illustrative purpose only and does not, in any way, try to limit the scope of the present invention.

Figure 1:
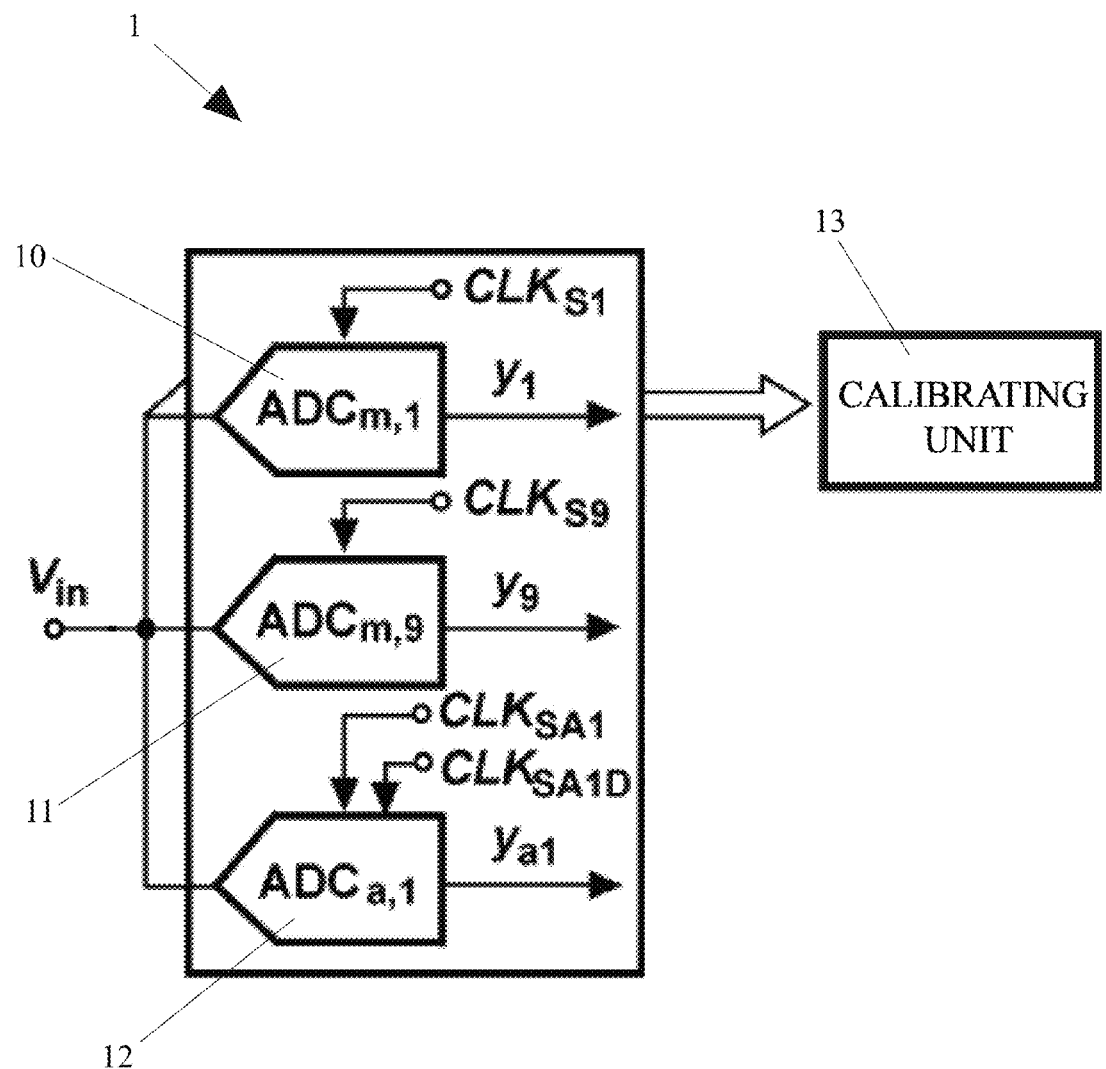
FIG. 1 is a system diagram showing the analog-to-digital converting system of the present invention.
Figure 2:
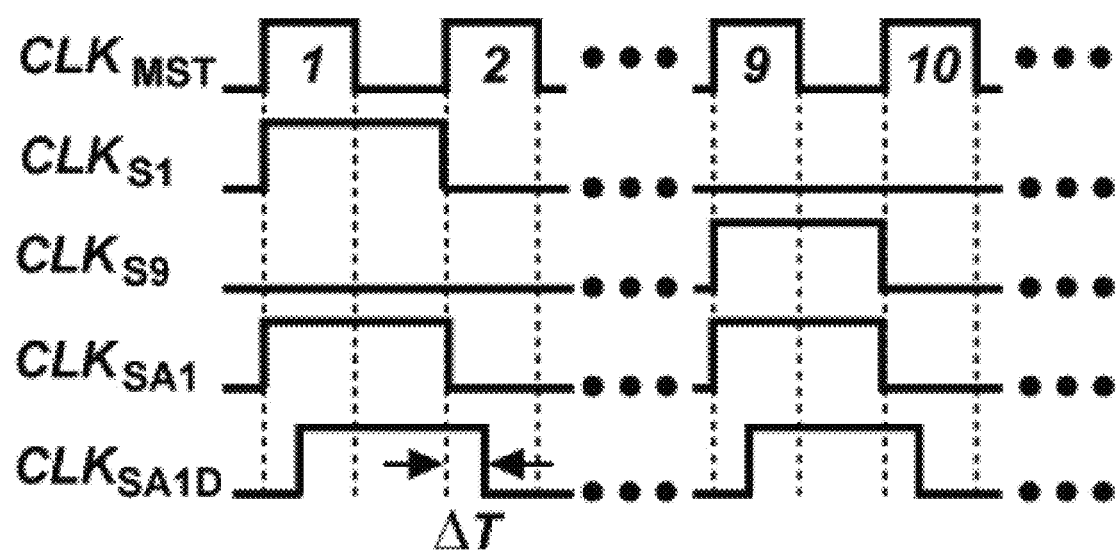
FIG. 2 is a sample clock diagram showing the analog-to-digital converting system of the present invention.
Figure 3:
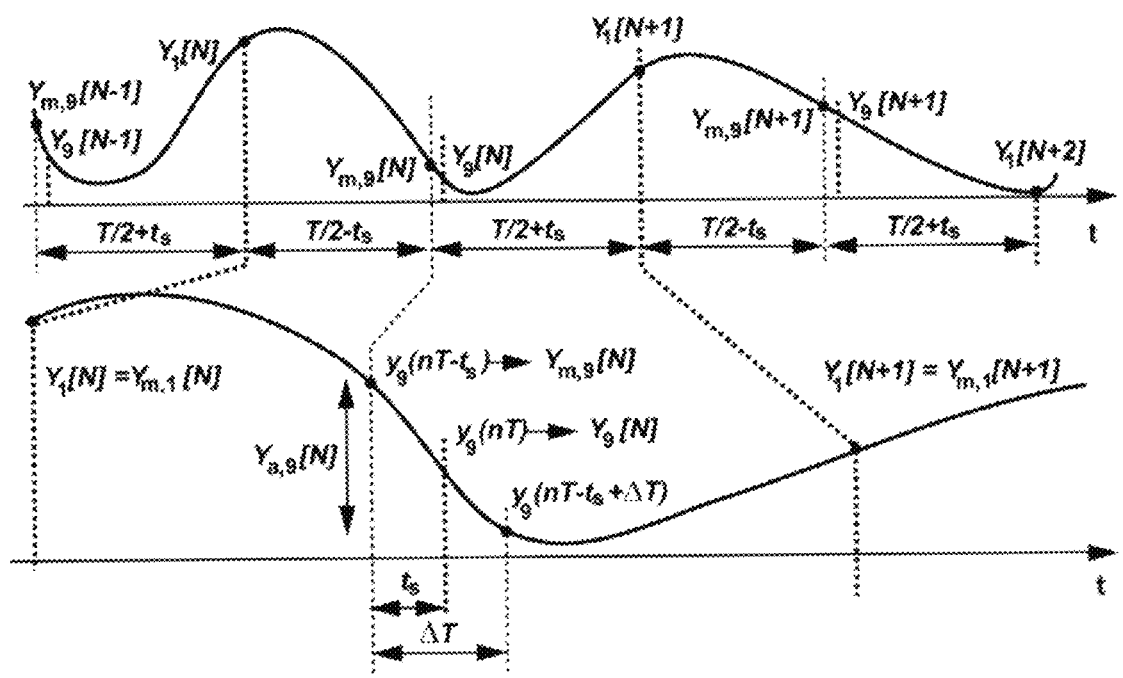
FIG. 3 is a perspective view showing quantizing a difference between the corresponding analog signal and the corresponding delayed analog signal of the present invention.

With reference to FIGS. 1, 2 and 3, the analog-to-digital converting system 1 of the present invention comprises at least one first main analog-to-digital converting unit 10, at least one second main analog-to-digital converting unit 11, at least one auxiliary analog-to-digital converting unit 12, and a calibrating unit 13.

The first main analog-to-digital converting unit 10 is located on a first channel $y_1$. The first channel $y_1$ has sample period T. Each first main analog-to-digital converting unit 10 receives a first sampled value. Each first sampled value has a first sample clock $CLK_{S1}$. The first sample clock $CLK_{S1}$ corresponds to the sample period T. The first main analog-to-digital converting unit 10 converts the first sampled value to a first skew-free quantized sequence $Y_{m,1}(N)$, where N is a natural number.

The second main analog-to-digital converting unit 11 is located on a second channel $y_9$. The second channel $y_9$ has the sample period T which is the same as the first channel $y_1$'s. Each second main analog-to-digital converting unit 11 receives a second sampled value $y_9(nT-t_s)$. Each second sampled value $y_9(nT-t_s)$ has a second sample clock $CLK_{S9}$ and a skew time $t_s$. The second sample clocks $CLK_{S9}$ correspond to the sample period T. Each second main analog-to-digital converting unit 11 converts the second sampled value $y_9(nT-t_s)$ to a second skew quantized sequence $Y_{m,9}(N)$, where n is integer. The skew time $t_s$ is due to the non-ideality of the sampling circuit.

The auxiliary analog-to-digital converting unit 12 is located on an auxiliary channel $y_{a1}$ next to the first channel $y_1$ or the second channel $y_9$. The auxiliary channel $y_{a1}$ has the sample period T which is the same as the first channel $y_1$'s. Each auxiliary analog-to-digital converting unit 12 receives a corresponding analog signal and a corresponding delayed analog signal $y_9(nT-t_s+\Delta T)$. The corresponding analog signal corresponds to the second sampled value $y_9(nT-t_s)$. The $y_9(nT-t_s+\Delta T)$ of the corresponding delayed analog signal $y_9(nT-t_s+\Delta T)$ is obtained from delaying a known time difference $\Delta T$ from $nT-t_s$ of the second sampled value. Each auxiliary analog-to-digital converting unit 12 quantizes a difference $y_9(nT-t_s+\Delta T)-y_9(nT-t_s)$ between the corresponding analog signal and the corresponding delayed analog signal to produce an auxiliary quantized sequence $Y_{a,9}(N)$.

The corresponding analog signal has a corresponding sample clock $CLK_{SA1}$ corresponding to the first sample clock $CLK_{S1}$ and the second sample clock $CLK_{S9}$. The corresponding delayed analog signal has a corresponding delayed sample clock $CLK_{SA1D}$. The corresponding delayed sample clock $CLK_{SA1D}$ is obtained from delaying the known time difference $\Delta T$ in the sampling edge of the first sample clock $CLK_{S1}$ and the second sample clock $CLK_{S9}$. The corresponding sample clock $CLK_{SA1}$ and the corresponding delayed sample clock $CLK_{SA1D}$ correspond to the sample period T.

The calibrating unit 13 is connected with the first main analog-to-digital converting unit 10, the second main analog-to-digital converting unit 11, and the auxiliary analog-to-digital converting unit 12. The calibrating unit 13 receives the sample period T, the first skew-free quantized sequence $Y_{m,1}(N)$, the skew time $t_s$, the second skew quantized sequence $Y_{m,9}(N)$, and the auxiliary quantized sequence $Y_{a,9}(N)$, and produces a skew-free quantized sequence $Y_9(N)$ of the second channel through a correction equation. The correction equation is defined as:

$$Y_9(N)=Y_{m,9}(N)+Y_{a,9}(N)[0-(-t_s)]/[(-t_s+\Delta T)-(-t_s)].$$

The correction equation is derived from an autocorrelation. The autocorrelation is defined as:

$R[-(T/2-ts)]-R(T/2+ts)=\Sigma_N[Y_{m,1}(N)Y_{m,9}(N)-Y_{m,1}(N+1)Y_{m,9}(N)]=K\times(-t_s)$, wherein R(t) is an autocorrelation and K is a proportionality factor that depends on the signal statistics. The skew information $K\times(-t_s)$ and $K\times(-t_s+\Delta T)$ can be obtained through a digital mixing operation.

Since the three sampling instances of nT, nT−$t_s$ and nT−$t_s$+ΔT are close in time compared to the sample period T, the three sampling points can be approximately connected by a straight line for the signal frequency up to Nyquist rate with the proper choice of the known time difference ΔT.

Thus, the correction equation is derived as follows:

$$Y_9(N)=Y_{m,9}(N)+Y_{a,9}(N)[0-K(-t_s)]/[K(-t_s+\Delta T)-K(-t_s)]$$

The exact value of the statistics-dependent factor K does not need to be calculated because K is cancelled out in the numerator and the denominator, which derives the correction equation:

$$Y_9(N)=Y_{m,9}(N)+Y_{a,9}(N)[0-(-t_s)]/[(-t_s+\Delta T)-(-t_s)].$$

Furthermore, rather than using the analog variable-delay line, realization of the correction equation can be fully achieved in the digital domain to save hardware complexity.

In a preferred embodiment of the present invention, before the calibrating unit 13 producing the skew-free quantized sequence $Y_9(N)$ of second channel, the calibrating unit 13 calibrates offset and gain mismatch of the first skew-free quantized sequence $Y_{m,1}(N)$, the second skew quantized sequence $Y_{m,9}(N)$, and the auxiliary quantized sequence $Y_{a,9}(N)$ through digital way.

Figure 4:
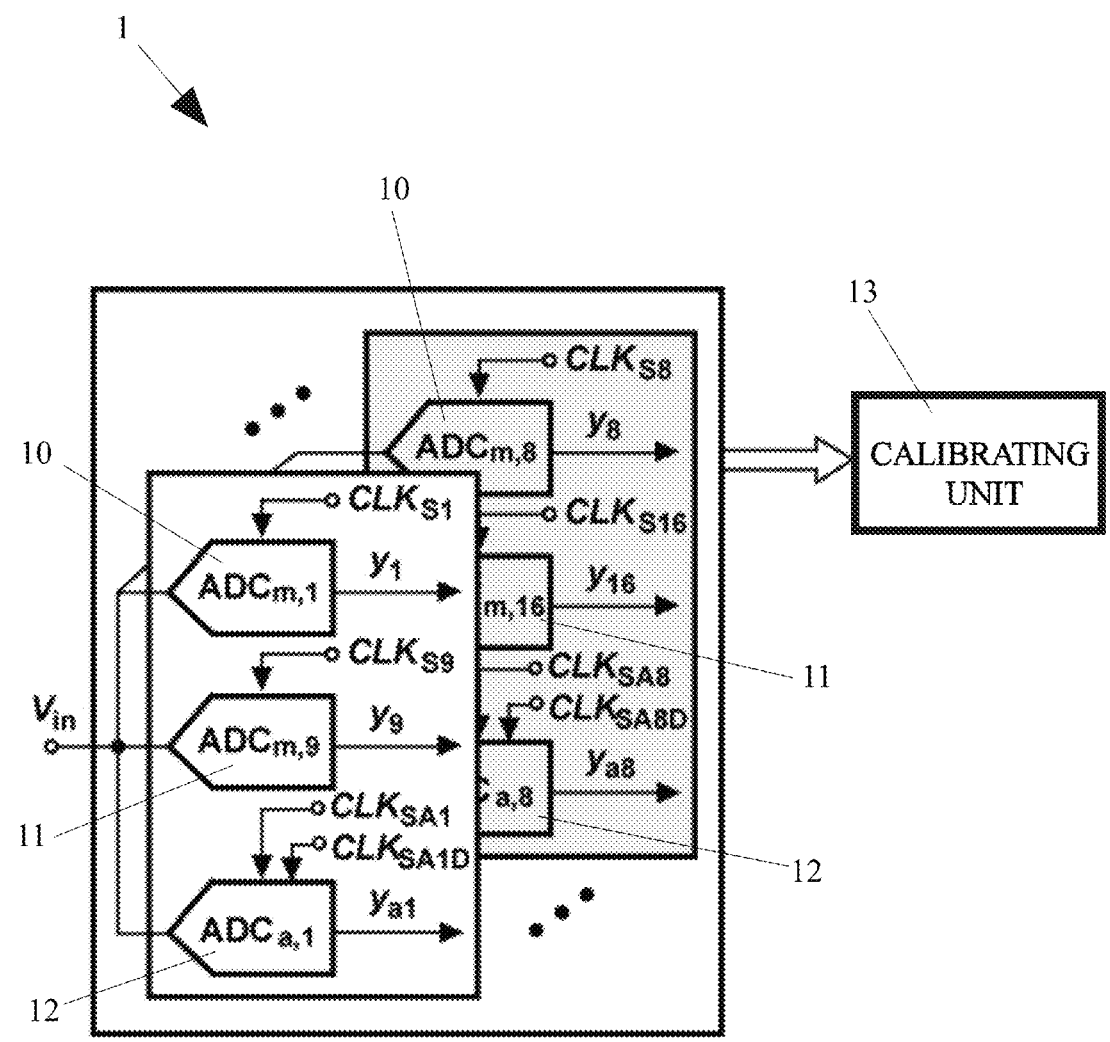
FIG. 4 is a system diagram showing one preferential embodiment of the analog-to-digital converting system of the present invention.
Figure 5:
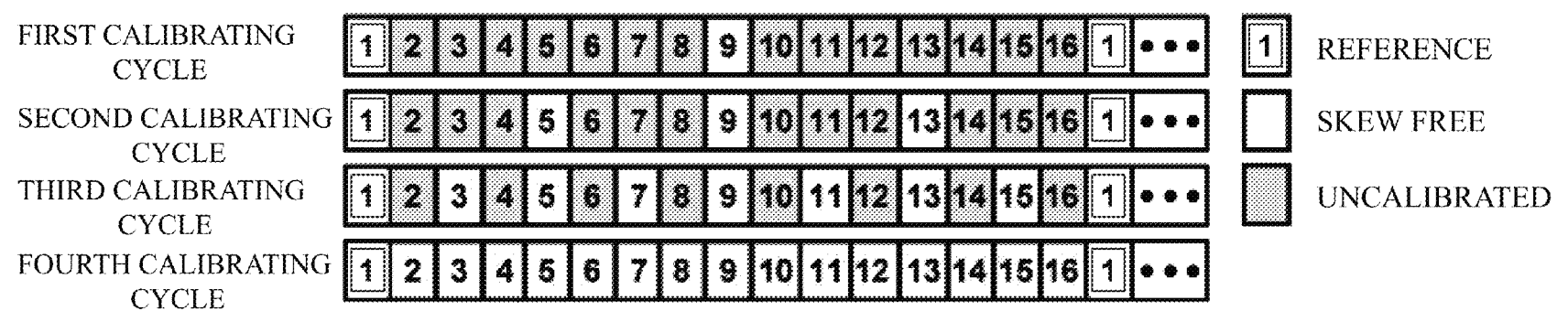
Figure 6:
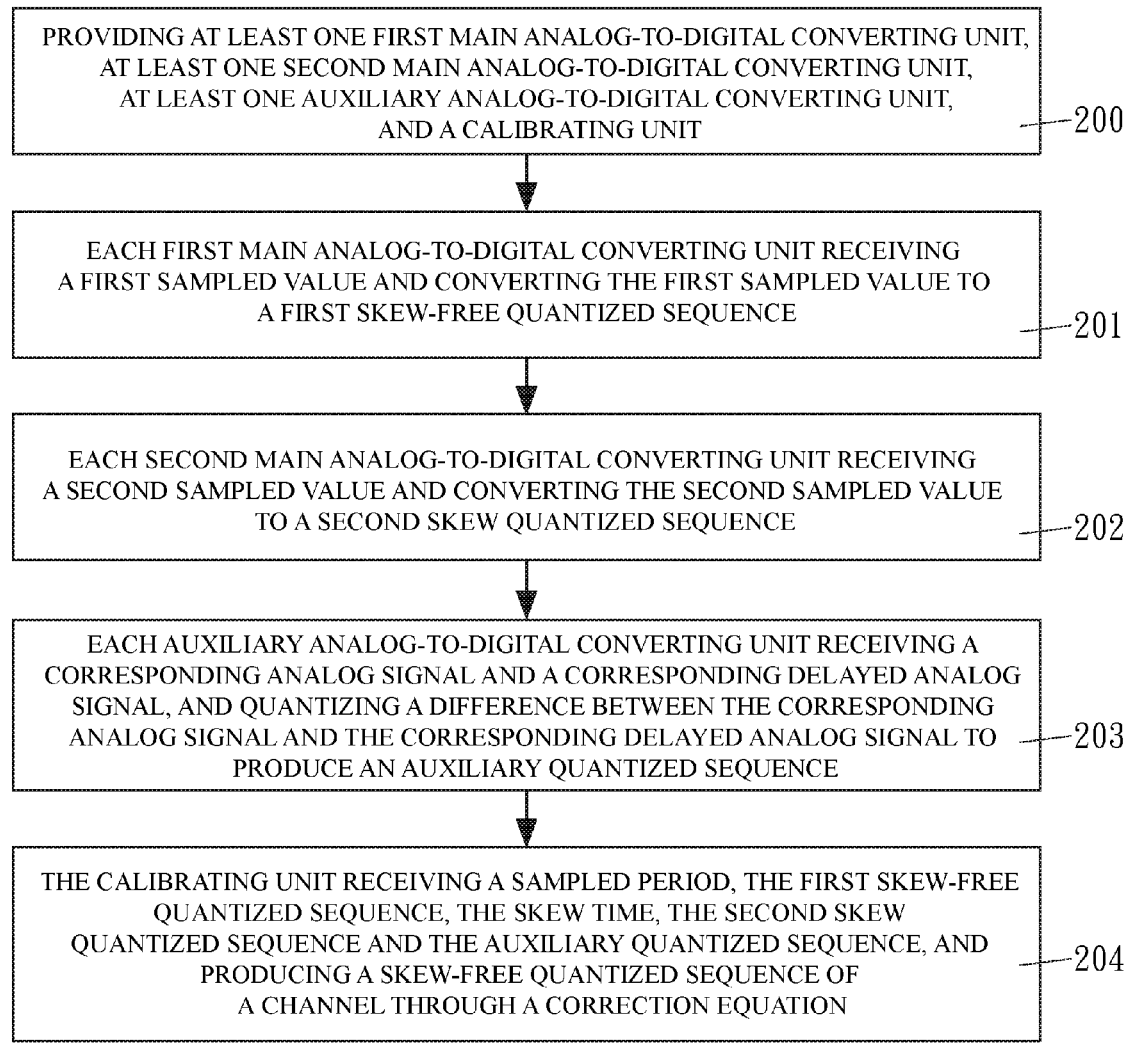
FIG. 6 is a flowchart showing the converting method for an analog-to-digital converting system of the present invention.
Figure 7:
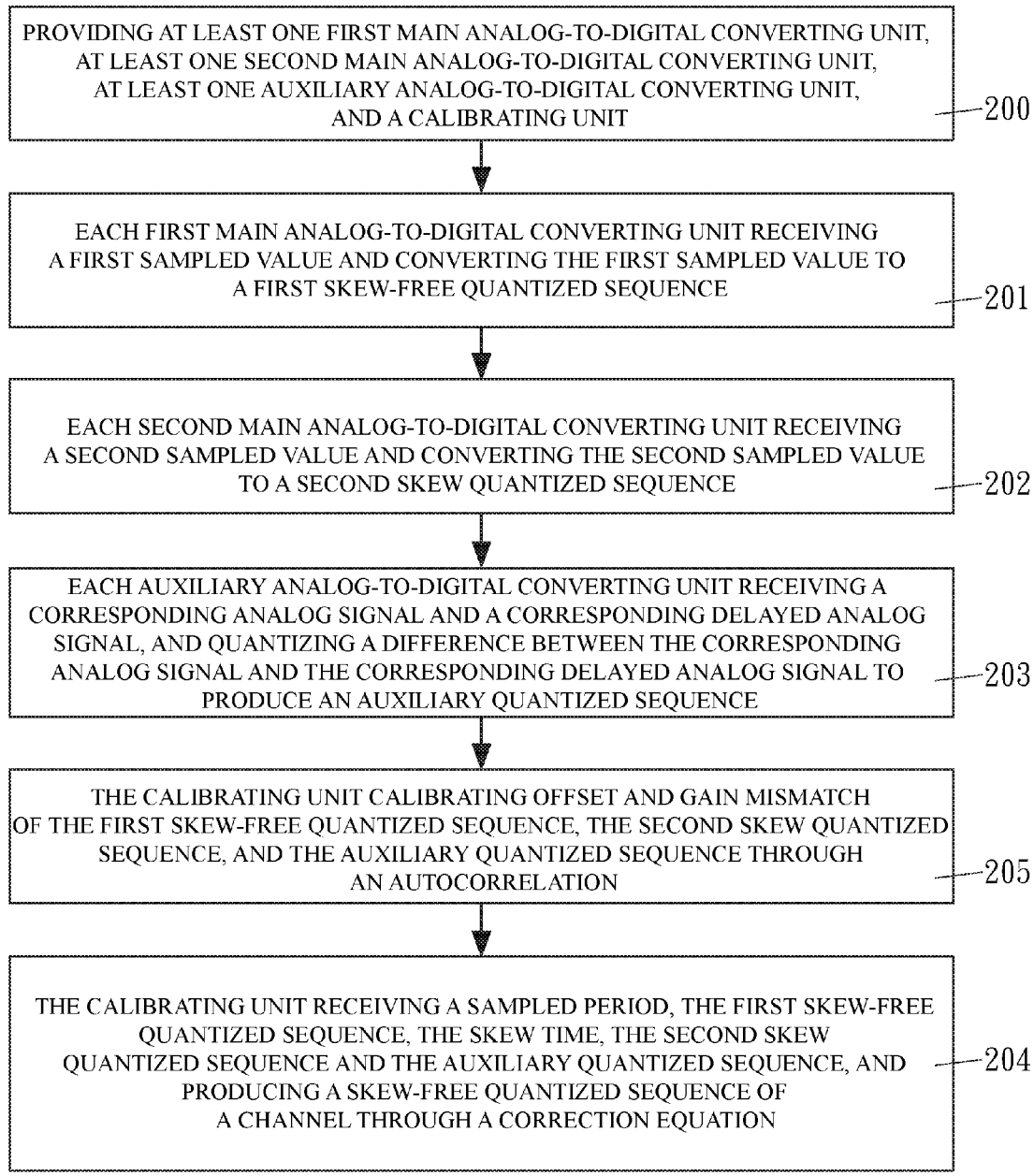
FIG. 7 is a flowchart showing one preferential embodiment of the converting method for an analog-to-digital converting system of the present invention.

With reference to FIGS. 1, 4 and 5, in another preferred embodiment of the present invention, the number of first main analog-to-digital converting units 10, second main analog-to-digital converting units 11, and auxiliary analog-to-digital converting units 12 are 8. Each first main analog-to-digital converting unit 10 and second main analog-to-digital converting unit 11 is operated in one sixteenth (1/16) of a sample frequency $f_s$. Each auxiliary analog-to-digital converting unit 12 is operated in one eighth (1/8) of the sample frequency $f_s$. The sample frequency $f_s$ is a reciprocal of the sample period T.

Each first main analog-to-digital converting unit 10 is located on a first channel $y_1$~$y_8$. The first main analog-to-digital converting units 10 are denoted as $ADC_{m,1}$~$ADC_{m,8}$ sequentially in FIG. 1 and FIG. 4. Each first sampled value has a first sample clock $CLK_{S1}$~$CLK_{S8}$. The first main analog-to-digital converting unit 10 converts the first sampled value to a first skew-free quantized sequence $Y_{m,1}(N)$~$Y_{m,8}(N)$.

Each second main analog-to-digital converting unit 11 is located on a second channel $y_9$~$y_{16}$. The second main analog-to-digital converting units 11 are denoted as $ADC_{m,9}$~$ADC_{m,16}$ sequentially in FIG. 1 and FIG. 4. Each second main analog-to-digital converting unit 11 receives a second sampled value $y_9(nT-t_s)$~$y_{16}(nT-t_s)$. Each second sampled value $y_9(nT-t_s)$ has a second sample clock $CLK_{S9}$~$CLK_{S16}$. Each second main analog-to-digital converting unit 11 converts the second sampled value $y_9(nT-t_s)$~$y_{16}(nT-t_s)$ to a second skew quantized sequence $Y_{m,9}(N)$~$Y_{m,16}(N)$.

Each auxiliary analog-to-digital converting unit 12 is located on an auxiliary channel $y_{a1}$~$y_{a8}$. The auxiliary analog-to-digital converting units 12 are denoted as $ADC_{a,1}$~$ADC_{a,8}$ sequentially in FIG. 1 and FIG. 4. The corresponding analog signal has a corresponding sample clock $CLK_{SA1}$~$CLK_{SA8}$ corresponding to the first sample clock $CLK_{S1}$~$CLK_{S8}$ and the second sample clock $CLK_{S9}$~$CLK_{S16}$. The corresponding delayed analog signal has a corresponding delayed sample clock $CLK_{SA1D}$~$CLK_{SA8D}$. The corresponding delayed sample clock $CLK_{SA1D}$~$CLK_{SA8D}$ is obtained from delaying the known time difference ΔT in the sampling edge of the first sample clock $CLK_{S1}$~$CLK_{S8}$ and the second sample clock $CLK_{S9}$~$CLK_{S16}$.

The first main analog-to-digital converting unit 10, the second main analog-to-digital converting unit 11, and the auxiliary analog-to-digital converting unit 12 receive an input voltage $V_{in}$.

In a preferred embodiment of the present invention, channel 1 $y_1$ among the channel $y_1$~$y_8$ is set as a reference and the skew of channel 9 $y_9$ among the channel 9 $y_9$~$y_{16}$ is estimated and corrected. After channel 9 $y_9$ is skew-free, channel 1 $y_1$ and channel 9 $y_9$ are employed as the reference for the skew correction of other channel 1 $y_2$~$y_8$ and other 2 $y_{10}$~$y_{16}$.

According to system simulations, 16,384 sampling points are required in every calibration cycle to achieve linearity. The process continues and the number of the calibrated channels grows exponentially until all the outputs are corrected. It takes 4 calibration cycles for the 16-channel time-interleaved ADC to be skew-free.

In a preferred embodiment of the present invention, the first sampled value, the second sampled value $y_9(nT-t_s)$, the corresponding analog signal, and the corresponding delayed analog signal are continuous signals in analog form.

In another preferred embodiment of the present invention, the first skew-free quantized sequence $Y_{m,1}(N)$, the second skew quantized sequence $Y_{m,9}(N)$, the auxiliary quantized sequence $Y_{a,9}(N)$, and the skew-free quantized sequence $Y_9(N)$ of a second channel $y_9$ are discrete signals in digital form.

With reference to FIGS. 1, 2, 3 and 6, a converting method 2 for an analog-to-digital converting system of the present invention comprises:

step 200: providing at least one first main analog-to-digital converting unit 10, at least one second main analog-to-digital converting unit 11, at least one auxiliary analog-to-digital converting unit 12, and a calibrating unit 13, wherein each second main analog-to-digital converting unit 11 is located on a second channel $y_9$, the second channel $y_9$ has sample period T;

step 201: each first main analog-to-digital converting unit 10 receiving a first sampled value and converting the first sampled value to a first skew-free quantized sequence $Y_{m,1}(N)$, wherein each first sampled value has a first sample clock $CLK_{S1}$, the first sample clock $CLK_{S1}$ corresponding to the sample period T;

step 202: each second main analog-to-digital converting unit 11 receiving a second sampled value $y_9(nT-t_s)$ and converting the second sampled value $y_9(nT-t_s)$ to a second skew quantized sequence $Y_{m,9}(N)$, wherein each second sampled value $y_9(nT-t_s)$ has a second sample clock $CLK_{S9}$ and a skew time $t_s$, the second sample clock $CLK_{S9}$ corresponding to the sample period T;

step 203: each auxiliary analog-to-digital converting unit 12 receiving a corresponding analog signal and a corresponding delayed analog signal $y_9(nT-t_s+\Delta T)$, and quantizing a difference $y_9(nT-t_s+\Delta T)-y_9(nT-t_s)$ between the corresponding analog signal and the corresponding delayed analog signal to produce an auxiliary quantized sequence $Y_{a,9}(N)$, the corresponding analog signal corresponding to the second sampled value $y_9(nT-t_s)$, the corresponding delayed analog signal $y_9(nT-t_s+\Delta T)$ delaying a known time difference ΔT from $nT-t_s$ of the second sampled value to get $y_9(nT-t_s+\Delta T)$; and step 204: the calibrating unit 13 receiving the sample period T, the first skew-free quantized sequence $Y_{m,1}(N)$, the skew time $t_s$, the second skew quantized sequence $Y_{m,9}(N)$, and the auxiliary quantized sequence $Y_{a,9}(N)$, and producing a skew-free quantized sequence of second channel $y_9$ through a correction equation, the correction equation defined as:

$$Y_9(N)=Y_{m,9}(N)+Y_{a,9}(N)[0-(-t_s)]/[(-t_s+\Delta T)-(-t_s)].$$

With reference to FIGS. 1, 2, 3 and 7, in a preferred embodiment of the present invention, the converting method 2a for an analog-to-digital converting system of the present invention further comprises a step 205 before the step 204: the calibrating unit 13 calibrating offset and gain mismatch of the first skew-free quantized sequence $Y_{m,1}(N)$, the second skew quantized sequence $Y_{m,9}(N)$, and the auxiliary quantized sequence $Y_{a,9}(N)$ through digital techniques.

With reference to FIGS. 2, 3, 4 and 7, in another preferred embodiment of the present invention, the number of first main analog-to-digital converting units 10, second main analog-to-digital converting units 11, and auxiliary analog-to-digital converting units 12 is 8 for each. Each first main analog-to-digital converting unit 10 and second main analog-to-digital converting unit 11 is operated in one sixteenth (1/16) of a sample frequency $f_s$. Each auxiliary analog-to-digital converting unit 12 is operated in one eighth (1/8) of the sample frequency $f_s$. The sample frequency $f_s$ is a reciprocal of the sample period T.

In another preferred embodiment of the present invention, the first sampled value, the second sampled value $y_9(nT-t_s)$, the corresponding analog signal, and the corresponding delayed analog signal are continuous signals in analog form.

In another preferred embodiment of the present invention, the first skew-free quantized sequence $Y_{m,1}(N)$, the second skew quantized sequence $Y_{m,9}(N)$, the auxiliary quantized sequence $Y_{a,9}(N)$, and the skew-free quantized sequence $Y_9(N)$ of a second channel $y_9$ are discrete signals in digital form.

Rather than using two identical main ADCs in each channel to digitally extract a signal difference, the auxiliary ADCs of the present invention delay a known time difference $\Delta T$ in the analog domain and quantize a difference between the corresponding analog signal and the corresponding delayed analog signal, leading to a much smaller signal swing because the known time difference $\Delta T$ is relatively small compared to the sample period of the interleaved ADC.

Through the above system and method, the auxiliary analog-to-digital converting unit of the present invention quantizes a difference between the corresponding analog signal and the corresponding delayed analog signal through delaying a known time difference $\Delta T$ by analog form, which has a smaller signal swing and achieves a 2.6 GHz sampling rate and a wide signal bandwidth when compared with the prior art analog-to-digital converters.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An analog-to-digital converting system comprising:
   at least one first main analog-to-digital converting unit being located on a first channel, the first channel having sample period T, each first main analog-to-digital converting unit receiving a first sampled value, each first sampled value having a first sample clock, the first sample clock corresponding to the sample period T, the first main analog-to-digital converting unit converting the first sampled value to a first skew-free quantized sequence $Y_{m,1}(N)$, wherein N is natural number;
   at least one second main analog-to-digital converting unit being located on a second channel, the second channel having the sample period T the same as the first channel's, each second main analog-to-digital converting unit receiving a second sampled value $y_9(nT-t_s)$, each second sampled value $y_9(nT-t_s)$ having a second sample clock and a skew time $t_s$, the second sample clock corresponding to the sample period T, each second main analog-to-digital converting unit converting the second sampled value $y_9(nT-t_s)$ to a second skew quantized sequence $Y_{m,9}(N)$, wherein n is integer;
   at least one auxiliary analog-to-digital converting unit being located on an auxiliary channel next to the first channel or the second channel, each auxiliary analog-to-digital converting unit receiving a corresponding analog signal and a corresponding delayed analog signal $y_9(nT-t_s+\Delta T)$, the corresponding analog signal corresponding to the second sampled value $y_9(nT-t_s)$, the $y_9(nT-t_s+\Delta T)$ of the corresponding delayed analog signal $y_9(nT-t_s+\Delta T)$ being obtained from delaying a known time difference $\Delta T$ from $nT-t_s$ of the second sampled value, each auxiliary analog-to-digital converting unit quantizing a difference $y_9(nT-t_s+\Delta T)-y_9(nT-t_s)$ between the corresponding analog signal and the corresponding delayed analog signal to produce an auxiliary quantized sequence $Y_{a,9}(N)$; and
   a calibrating unit being connected with the first main analog-to-digital converting unit, the second main analog-to-digital converting unit, and the auxiliary analog-to-digital converting unit, the calibrating unit receiving the sample period T, the first skew-free quantized sequence $Y_{m,1}(N)$, the skew time $t_s$, the second skew quantized sequence $Y_{m,9}(N)$, and the auxiliary quantized sequence $Y_{a,9}(N)$, and producing a skew-free quantized sequence $Y_9(N)$ of the second channel through a correction equation, the correction equation defined as $Y_9(N)=Y_{m,9}(N)+Y_{a,9}(N)[0-(-t_s)]/[(-t_s+\Delta T)-(-t_s)]$,
   wherein timing information $(-t_s+\Delta T)$ and $(-t_s)$ is obtained through autocorrelation and the autocorrelation is defined as:
   $\Sigma_N[Y_{m,1}(N)Y_{m,9}(N)-Y_{m,1}(N+1)Y_{m,9}(N)]=K\times(-t_s)$ for $(-t_s)$, K is a proportionality factor that depends on signal statistics.

2. The analog-to-digital converting system as claimed in claim 1, wherein a quantity of first main analog-to-digital converting units, second main analog-to-digital converting units, and auxiliary analog-to-digital converting units is 8 for each, and each first main analog-to-digital converting unit and each second main analog-to-digital converting unit is operated in one sixteenth (1/16) of a sample frequency, and each auxiliary analog-to-digital converting unit is operated in one eighth (1/8) of the sample frequency, the sample frequency is a reciprocal of the sample period T.

3. The analog-to-digital converting system as claimed in claim 1, wherein the first sampled value, the second sampled value, the corresponding analog signal, and the corresponding delayed analog signal are continuous analog signals.

4. The analog-to-digital converting system as claimed in claim 1, wherein the first skew-free quantized sequence, the second skew quantized sequence, the auxiliary quantized sequence, and the skew-free quantized sequence of the second channel are digital signals.

5. A converting method for an analog-to-digital converting system, the converting method comprises:

step A: providing at least one first main analog-to-digital converting unit, at least one second main analog-to-digital converting unit, at least one auxiliary analog-to-digital converting unit, and a calibrating unit, wherein each second main analog-to-digital converting unit being located on a channel, the channel has sample period T;

step B: each first main analog-to-digital converting unit receiving a first sampled value and converting the first sampled value to a first skew-free quantized sequence $Y_{m,1}(N)$, wherein each first sampled value has a first sample clock, the first sample clock corresponding to the sample period T;

step C: each second main analog-to-digital converting unit receiving a second sampled value $y_9(nT-t_s)$ and converting the second sampled value $y_9(nT-t_s)$ to a second skew quantized sequence $Y_{m,9}(N)$, wherein each second sampled value $y_9(nT-t_s)$ has a second sample and a skew time $t_s$, the second sample clock corresponding to the sample period T;

step D: each auxiliary analog-to-digital converting unit receiving a corresponding analog signal and a corresponding delayed analog signal $y_9(nT-t_s+\Delta T)$, and quantizing a difference $y_9(nT-t_s+\Delta T)-y_9(nT-t_s)$ between the corresponding analog signal and the corresponding delayed analog signal to produce an auxiliary quantized sequence $Y_{a,9}(N)$, wherein the corresponding analog signal corresponds to the second sampled value $y_9(nT-t_s)$, the corresponding delayed analog signal $y_9(nT-t_s+\Delta T)$ delaying a known time difference $\Delta T$ from $nT-t_s$ of the second sampled value to get $y_9(nT-t_s+\Delta T)$; and step E: the calibrating unit receiving the sample period T, the first skew-free quantized sequence $Y_{m,1}(N)$, the skew time $t_s$, the second skew quantized sequence $Y_{m,9}(N)$, and the auxiliary quantized sequence $Y_{a,9}(N)$, and producing a skew-free quantized sequence of the channel through a correction equation, the correction equation defined as $Y_9(N)=Y_{m,9}(N)+Y_{a,9}(N)[0-(-t_s)]/[(-t_s+\Delta T)-(-t_s)]$, wherein timing information $(-t_s+\Delta T)$ and $(-t_s)$ is obtained through autocorrelation and the autocorrelation is defined as:

$\Sigma_N[Y_{m,1}(N)Y_{m,9}(N)-Y_{m,1}(N+1)Y_{m,9}(N)]=K\times(-t_s)$ for $(-t_s)$, K is a proportionality factor that depends on signal statistics.

6. The converting method as claimed in claim 5, wherein a quantity of first main analog-to-digital converting units, second main analog-to-digital converting units, and auxiliary analog-to-digital converting units is 8 for each, and each first main analog-to-digital converting unit and each second main analog-to-digital converting unit is operated in one sixteenth (1/16) of a sample frequency, each auxiliary analog-to-digital converting unit is operated in one eighth (1/8) of the sample frequency, the sample frequency is a reciprocal of the sample period T.

7. The converting method as claimed in claim 5, wherein the first sampled value, the second sampled value, the corresponding analog signal, and the corresponding delayed analog signal are continuous analog signals.

8. The converting method as claimed in claim 5, wherein the first skew-free quantized sequence, the second skew quantized sequence, the auxiliary quantized sequence, and the skew-free quantized sequence of the channel are digital signals.

* * * * *